United States Patent
Pfeiffer et al.

(10) Patent No.: US 6,597,200 B2
(45) Date of Patent: Jul. 22, 2003

(54) CIRCUIT ARRANGEMENT FOR SCALABLE OUTPUT DRIVERS

(75) Inventors: Michael Pfeiffer, Munich (DE); Andreas Täuber, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/100,467

(22) Filed: Mar. 18, 2002

(65) Prior Publication Data

US 2002/0186057 A1 Dec. 12, 2002

(30) Foreign Application Priority Data

Mar. 16, 2001 (DE) ........................... 101 12 852

(51) Int. Cl.[7] .............................. H03K 19/00
(52) U.S. Cl. ........................ 326/83; 326/102
(58) Field of Search ................. 326/82, 83, 86, 326/101, 102, 103

(56) References Cited

FOREIGN PATENT DOCUMENTS

| JP | 03238919 A | 10/1991 | ....... H03K/19/0175 |
| JP | 06053318 A | 2/1994 | ........... H01L/21/82 |
| JP | 06266798 A | 9/1994 | ........... G06F/15/60 |
| JP | 06318685 A | 11/1994 | ......... H01L/27/118 |

*Primary Examiner*—Don Le
(74) *Attorney, Agent, or Firm*—Fish & Richardson P.C.

(57) ABSTRACT

The invention provides a circuit arrangement for scalable output drivers, symmetrically arranged driver transistor groups being provided which each have transistor pairs having the same transistor line width. If there are m different driver transistor groups present, $2^{(n-1)}$ different gradations result, thereby achieving good scalability. Furthermore, a transistor line width that is simple to design is provided for all transistors of all driver transistor groups, thereby providing identical electrical properties with respect to an output terminal unit.

22 Claims, 6 Drawing Sheets

CIRCUIT ARRANGEMENT FOR SCALABLE OUTPUT DRIVERS

The present invention relates to a circuit arrangement for scalable output drivers, and relates in particular to a circuit arrangement with symmetrical positioning of n- and p-channel transistors as output drivers.

Conventionally, a pair of n- and p-channel transistors is used in a driver arrangement in such a way that, in a manner dependent on an input voltage, an output voltage can be varied between a ground level and a plus voltage level of a voltage supply line. In accordance with an output power demand, the pair of driver transistors is designed as driver transistor group in such a way that a line width, i.e. a width of transistors as a dimension perpendicular to a source-drain path and parallel to an interconnect layer plane, is varied between the source terminal and the drain terminal from driver transistor group to driver transistor group. This line width is referred to as transistor line width below.

The driver transistors are embodied for example as field-effect transistors (FET), which are disclosed inter alia in "Johannes Lehmann: Feldeffekt-Transistoren [Field-effect transistors], Vogel-Verlag, ISBN 3-8023-0066-1 (pages 22–25)" and "U. Tietze and Ch. Schenk: Halbleiter-schaltungstechnik [Semiconductor circuitry], 5th Edition, Springer-Verlag, ISBN 3-540-09848-8 (pages 77–91)".

Such driver stages comprising a pair of n- and p-channel transistors are designed as transistor driver groups and are in many cases used as output drivers for electronic circuits (OCD=Off-Chip Driver). In this case, scalability of the output drivers is demanded in order to comply with different applications with regard to an output power, an output voltage, an output current, etc.

Scalability of a driver stage or of a driver transistor group can be achieved by effecting splitting into individual transistor pairs whose transistor line width is adjustable. If a plurality of transistor pairs having a different transistor line width are present, this results in unfavorable area utilization for circuit arrangements according to the prior art, since long, narrow geometrical forms are produced.

Figure 3:
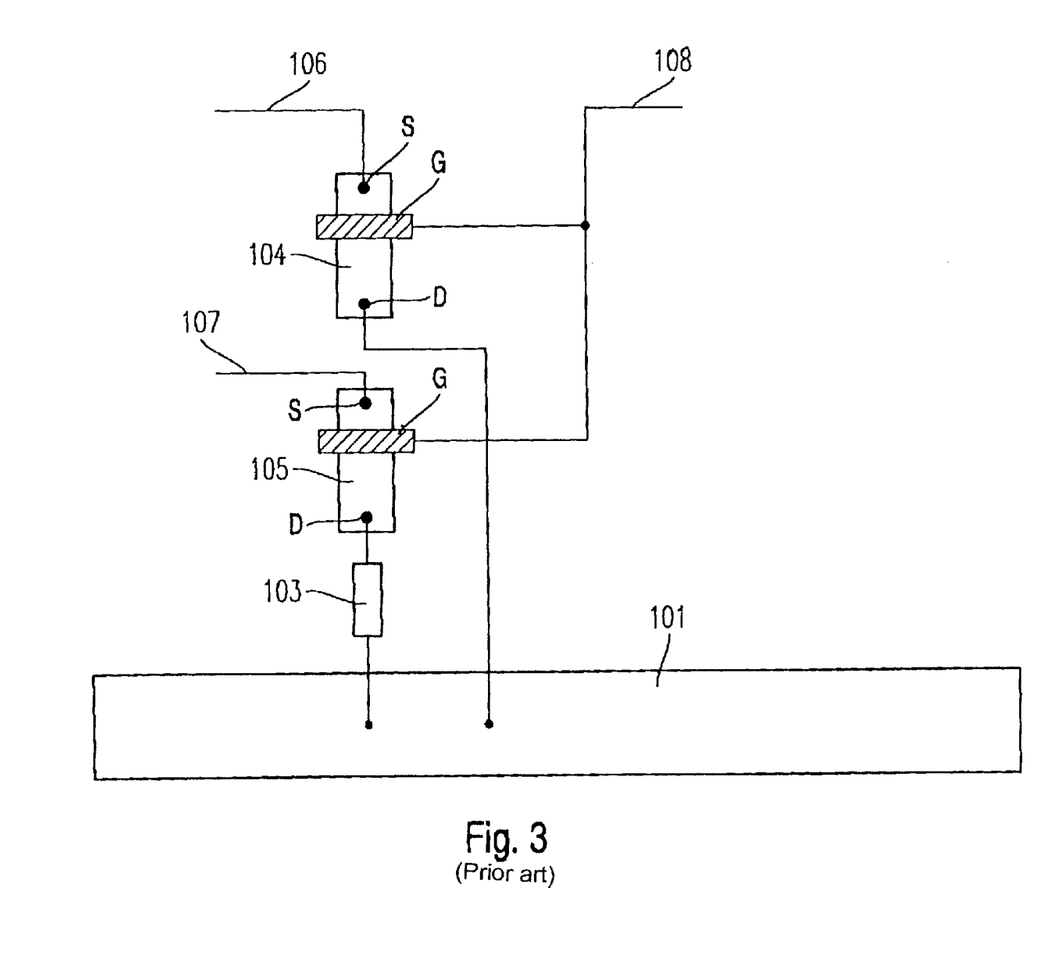
FIG. 3 shows a driver transistor group having an n-channel transistor and a p-channel transistor which is constructed in accordance with a conventional circuit arrangement.

FIG. 3 shows a line driver according to the prior art, in which, by way of example, a driver transistor pair, comprising a p-channel transistor 104 and an n-channel transistor 105, is connected to an output terminal unit 101. In this case, the drain terminal of the p-channel transistor 104 is connected via a line to the output terminal unit, which is simultaneously connected to a drain terminal of the n-channel transistor 105 via a resistance element 103.

The resistance element 103 serves to protect the n-channel transistor 105 against electrostatic discharges and the like. The source terminal of the n-channel transistor 105 is connected to a ground line 107, while the source terminal of the p-channel transistor 104 is connected to a voltage supply line 106, via which a supply voltage $V_{cc}$ is fed.

If a control signal is simultaneously fed to the gate terminal of the p-channel transistor 104 and to the gate terminal of the n-channel transistor 105 via a control line 108, then it is possible to vary a voltage level of an output terminal unit 101 with regard to the ground line 107 and the voltage supply line 105 and thus to realize a driver function.

Figure 4:
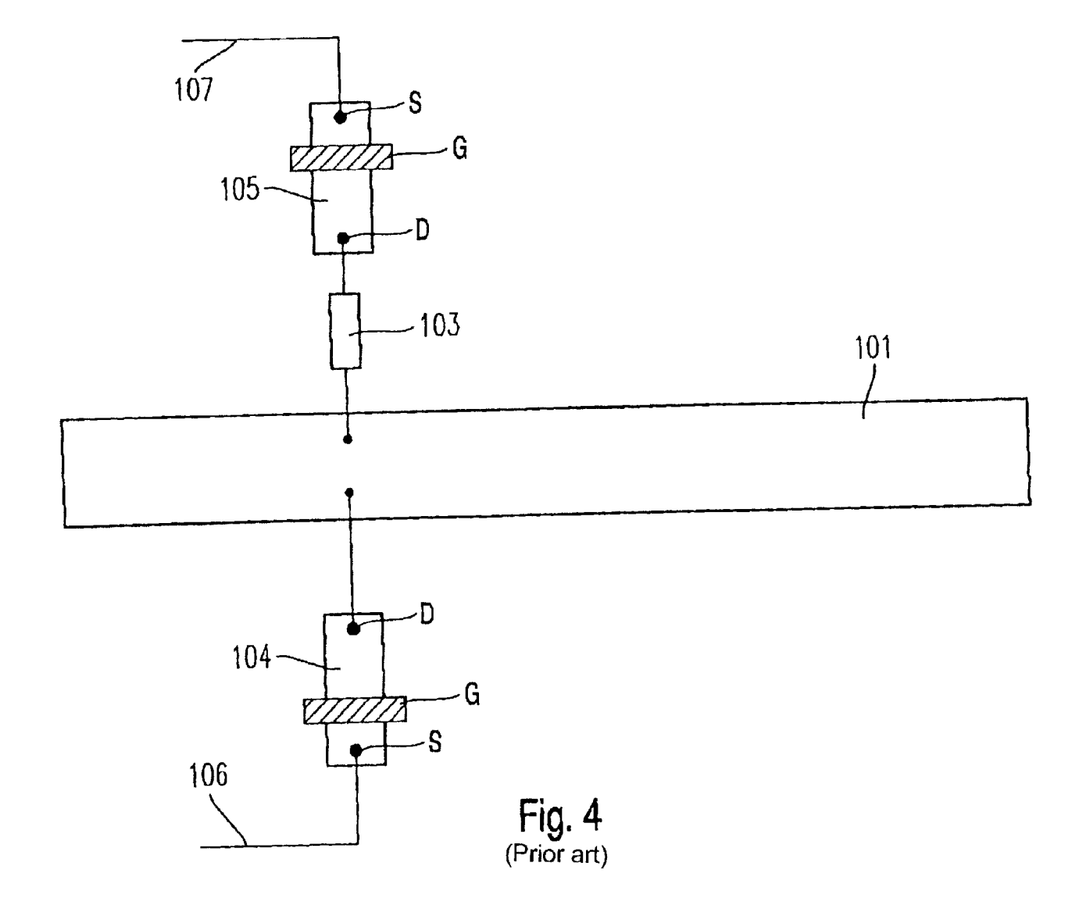
FIG. 4 shows a further example of a circuit arrangement of a driver transistor group, which comprises an n-channel transistor and a p-channel transistor according to the prior art.

A further conventional circuit arrangement of an output driver using a transistor pair which forms a driver transistor group is shown in FIG. 4. In this case, the two transistors 104, 105 are arranged on both sides of an output terminal unit 101. The line connections correspond to those shown in FIG. 3, i.e. simultaneous driving of the gate terminals of the two driver transistors 104, 105 makes it possible to vary a potential of the output terminal unit 101 with regard to ground. It is also the case with the conventional circuit arrangement shown in FIG. 3 that the two gate terminals must be connected to one another and to a control line, in this case there being the disadvantage, in particular, that the two gate terminals to be connected are arranged on opposite sides of the output terminal unit 101.

One disadvantage of the conventional circuit arrangements for output drivers as shown by way of example in FIGS. 3 and 4 is that scalability can be achieved only with a large area requirement.

A further disadvantage of conventional circuit arrangements is that line connections between the output terminal unit 101 and the corresponding driver transistors have different electrical properties. In the case of the arrangement shown in FIG. 3, the p-channel transistor 104 is located further away from the output terminal unit 101 than the n-channel transistor 105. This different distance of the line connections leads to propagation time differences and hence to asymmetrical driving of the output driver.

The circuit arrangement shown in FIG. 4 has the fundamental disadvantage that the p-channel transistor 104 and n-channel transistor 105 belonging to a pair of driver transistors lie on different sides of the output terminal unit 101, resulting in very unfavorable area utilization.

Consequently, it is an object of the present invention to provide a circuit arrangement in which optimum area utilization is ensured and in which, moreover, as far as possible identical interconnect widths and interconnect lengths from the driver transistors to the output terminal unit are provided.

Scalability must be achieved in that, in the case of a higher output power demand (in the case of a higher voltage demand and/or in the case of a higher current demand), a transistor line width of driver transistors must be able to be increased, corresponding transistor line widths preferably differing by powers of 2.

The object of the present invention is achieved by means of a circuit arrangement according to claim 1 and a method according to claim 17.

A main advantage of the invention is that the circuit arrangement according to the invention is symmetrical with regard to output interconnects and propagation time differences between corresponding driver transistors and an output terminal unit.

The drain terminals of the n- and p-channel transistors advantageously have identical electrical properties in the direction of the output terminal unit, thereby achieving, inter alia, strength in the circuit to withstand electrostatic discharges.

The driver arrangement is preferably scalable by implementing splitting into a suitable number of driver transistor groups, a driver transistor group being formed by a p-channel transistor and an n-channel transistor. Scalability can then be achieved in a simple manner in that individual driver transistor groups can be activated, whose transistor line width differs by powers of 2. Given four driver transistor groups, these are, for example, transistor line widths of B, B/2, B/4 and B/8.

In this way, the driver arrangement is subdivided into driver subunits. The total connection, i.e. the totality of all the output interconnects, is preferably split into individual connections, i.e. in each case two output interconnects for a driver transistor group comprising a p-channel transistor and an n-channel transistor.

A compact circuit arrangement is advantageously achieved, thereby ensuring optimum area utilization.

The transistors which form driver transistor groups are preferably combined in single p-channel units, single n-channel units, double n-channel units and double p-channel units.

The heart of the invention is a circuit arrangement for scalable output drivers, interconnects being arranged symmetrically between an output terminal unit and a driver transistor group comprising an n- and a p-channel transistor, and scalability being ensured in that in each case p-channel transistors and n-channel transistors are grouped in double n-channel units and double p-channel units.

Advantageous developments and improvements of the respective subject matter of the invention can be found in the subclaims.

In accordance with one preferred development of the present invention, a driver transistor group is formed from an n-channel transistor and a p-channel transistor, a resistance element being inserted between the drain terminal of the n-channel transistor and the output terminal unit in order to provide protection against an electrostatic discharge and the like.

In accordance with yet another preferred development of the present invention, the first output interconnects and the second output interconnects of the driver transistor group have identical line lengths toward an output terminal unit.

In accordance with yet another preferred development of the present invention, the transistors of a driver transistor group which are connected to the output terminal unit via the first and second output interconnects furthermore have an identical transistor line width. This ensures that both transistors of a driver transistor group are exposed to identical electrical properties with regard to the output terminal unit.

In accordance with a further preferred development of the present invention, a resistance element is provided which is symmetrically connected between a drain resistance interconnect and a second output interconnect.

In accordance with yet another preferred development of the present invention, at least one further driver transistor group, once again in each case having a p-channel transistor and an n-channel transistor, is arranged symmetrically with regard to a line of symmetry running parallel to the second output interconnect, with the result that two driver transistor groups are provided for driving the output terminal unit.

In accordance with yet another preferred development of the present invention, generally a number of m driver transistor groups are provided, which are in each case arranged symmetrically in such a way that in each case two n-channel units and in each case two p-channel units are arranged such that they are located next to one another. A driver structure comprising 2m driver transistors is provided in this way.

In accordance with yet another preferred development of the present invention, a resistance element connected between the drain terminal of an n-channel transistor and the output terminal unit serves to provide protection against electrostatic discharges (ESD), the resistance element being formed as a resistance element layer arranged in a second interconnect layer, which is different from the interconnect layer carrying the first and second output interconnects and the drain resistance interconnect.

In accordance with yet another preferred development of the present invention, the source-drain path of the p-channel transistors or of the n-channel transistors is oriented parallel to the output terminal unit.

In accordance with yet another preferred development of the present invention, the resistance element is oriented parallel to the output terminal unit.

In accordance with yet another preferred development of the present invention, the n-channel transistors and the p-channel transistors are field-effect transistors (FET).

In accordance with yet another preferred development of the present invention, changes of direction in the first and second output interconnects and in the drain resistance interconnect are formed in angles of 45°, in order to avoid spraying or spike effect s which can originate from an increased electric field strength at the edges of interconnects. These spraying or spike effects are formed in an intensified fashion in particular in the case of changes in direction of interconnects of 90°.

In accordance with yet another preferred development of the present invention, the driver transistor groups are freely scalable by means of a free scalability of the transistor line width of the transistors.

In accordance with yet another preferred development of the present invention, the resistance element tracks arranged parallel to the terminal units are freely scalable.

In accordance with a further preferred development, an output voltage which is provided by the totality of the driver transistor groups and is present at the output terminal unit is freely adjustable between 0 volts and $V_{CC}$, i.e. the voltage of the voltage supply line.

In accordance with yet another preferred development of the present invention, a transistor line width for a respective pair of transistors which form a driver transistor group is freely adjustable. The transistor line width is preferably set in powers of 2 in order to achieve simple scalability.

In accordance with a further preferred development of the present invention, the n- and p-channel transistors are designed in such a way that a gate terminal is located asymmetrically with regard to the source-drain path of the respective transistor in such a way that the distance between the gate terminal and the first output interconnect or the second output interconnect is greater than the distance between the respective gate terminal and the corresponding drain terminal or source terminal, thereby achieving an increase in protection against an electrostatic discharge which adversely affects the gate terminal, in particular.

Exemplary embodiments of the invention are illustrated in the drawings and explained in more detail in the description below. In the figures, identical reference symbols designate identical or functionally identical components.

IN THE DRAWINGS

In the figures, identical reference symbols designate identical or functionally identical components.

Figure 1:
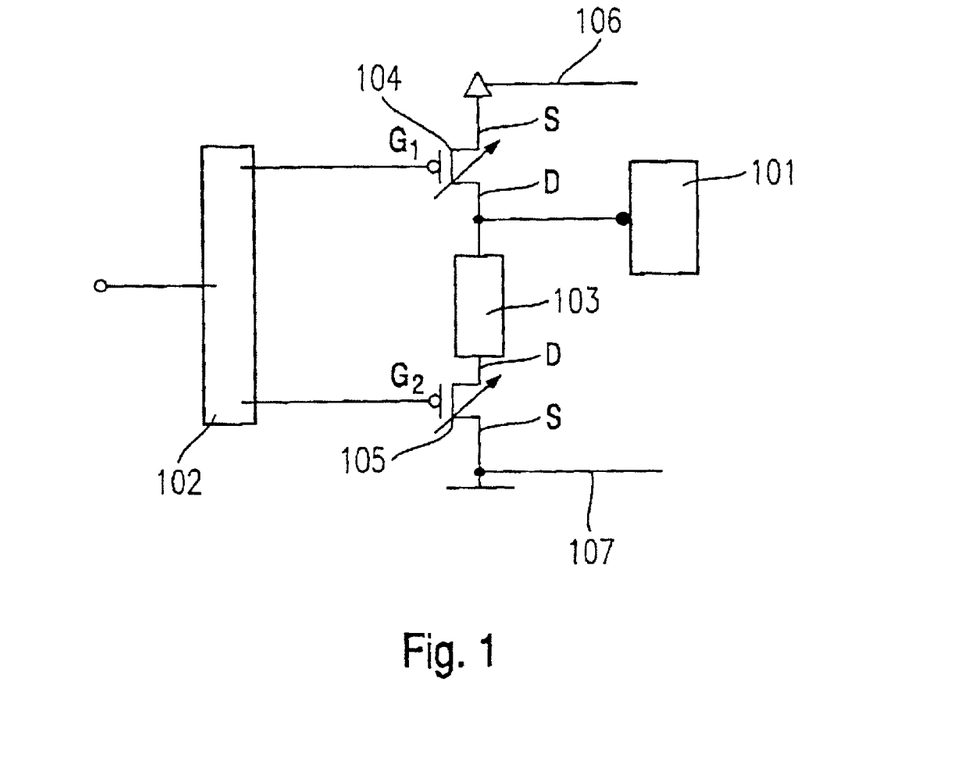
FIG. 1 shows a circuit diagram illustrating a driver transistor group with a p-channel transistor and an n-channel transistor.

In the circuit arrangement shown in FIG. 1, a control signal is fed to an input terminal unit 102, said control signal serving for controlling two driver transistors, which form the driver transistor group shown in FIG. 1. The input terminal unit 102 is connected to a gate terminal of a p-channel transistor 104 and a gate terminal of an n-channel transistor 105. The source terminal of the p-channel transistor 104 is connected to a voltage supply line 106. The source terminal of the n-channel transistor 105 is connected to a ground line 107. A resistance element 103 is connected between the drain terminal of the n-channel transistor 105 and the drain terminal of the p-channel transistor 104, the drain terminal of the p-channel transistor 104 likewise being connected to an output terminal unit 101.

The circuit arrangement of the driver transistor group shown makes it possible, in a manner dependent on a signal applied to the input terminal unit 102, to vary an output voltage at the output terminal unit 101 between the potential of the ground line 107 (0 V) and the potential of the voltage supply line 106 ($V_{CC}$).

The circuit diagram shown in FIG. 1 is used in the driver stages of the circuit arrangement for scalable output drivers in accordance with the exemplary embodiment of the present invention.

Figure 5:
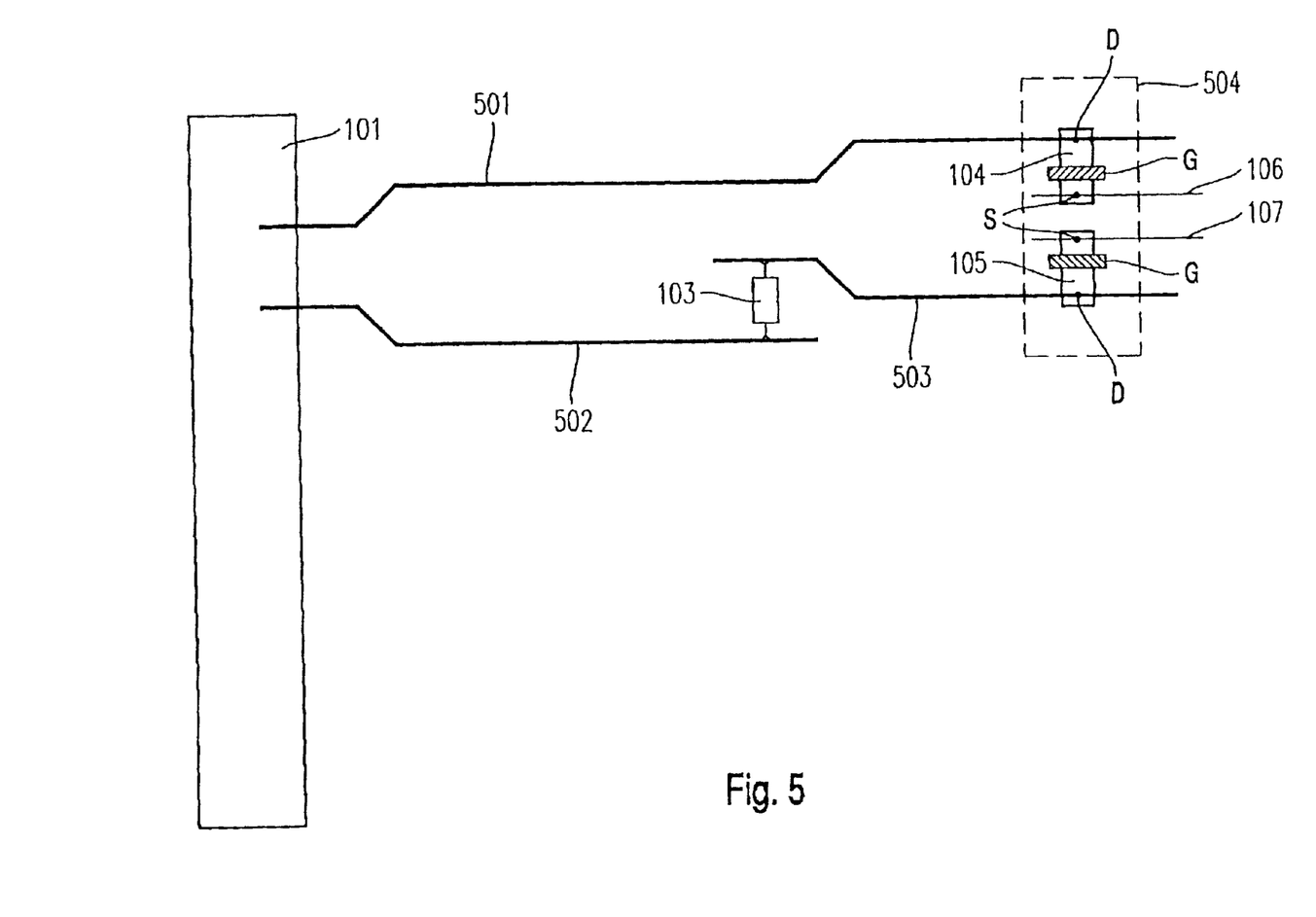
FIG. 5 shows a circuit arrangement for scalable output drivers according to the present invention, the arrangement and driving of a driver transistor group which comprises an n-channel transistor and a p-channel transistor being illustrated.

FIG. 5 shows a circuit arrangement for scalable output drivers according to the present invention, the arrangement and driving of a driver transistor group which comprises an n-channel transistor and a p-channel transistor being illustrated.

In the case of the circuit arrangement shown in FIG. 5, a first output interconnect 501 runs from a drain terminal of the p-channel transistor 104, whose source-drain path lies perpendicular to the first output interconnect 501, to the output terminal unit 101. In this exemplary embodiment, changes in direction in the interconnect are embodied in 45° steps, in order to ensure protection against spraying and spike effects and to reduce increased field strengths at edges.

In this case, the horizontal sections of the first output interconnect 501 run at distances from adjacent interconnects which are prescribed in accordance with the pitches provided in the production process. The source terminal of the p-channel transistor 104 is connected to a voltage supply line which runs in a further interconnect layer parallel to the first output interconnect.

In the same way, the n-channel transistor 105 is connected with its source-drain path perpendicular to a drain resistance interconnect running parallel to the first output interconnect. In this case, the drain terminal of the n-channel transistor 105 is connected to the drain resistance interconnect 503, while the source terminal of the n-channel transistor 105 is connected to the ground line 107. The resistance element 103, which is arranged as a resistance interconnect in a second interconnect layer of the circuit construction, is connected between the drain resistance interconnect 503, offset by two changes in direction of 45°, and the second output interconnect 502.

Figure 2:
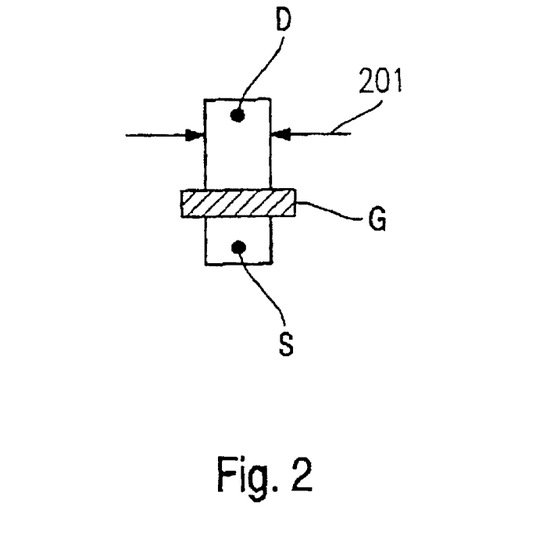
FIG. 2 shows a diagrammatic illustration of an individual driver transistor having a source terminal S, a gate terminal G and a drain terminal D, as is used in driver transistor groups according to the present invention.

In the same way as the first output interconnect, the second output interconnect is connected to the output terminal unit 101 after in each case a further two changes in direction of 45°. In this way, a symmetrical structure is formed which allows transistor pairs belonging to respective driver transistor groups to be formed identically and to be scaled with regard to their transistor line width. With reference to FIG. 2, the dimension of the transistor perpendicular to the source-drain path of the transistor parallel to the interconnect layer plane is designated as transistor line width 201.

By virtue of the symmetrical arrangement shown in FIG. 5, the line connections between the respective driver transistors of a driver transistor group 504 have identical electrical properties with respect to the output terminal unit 101.

Figure 6:
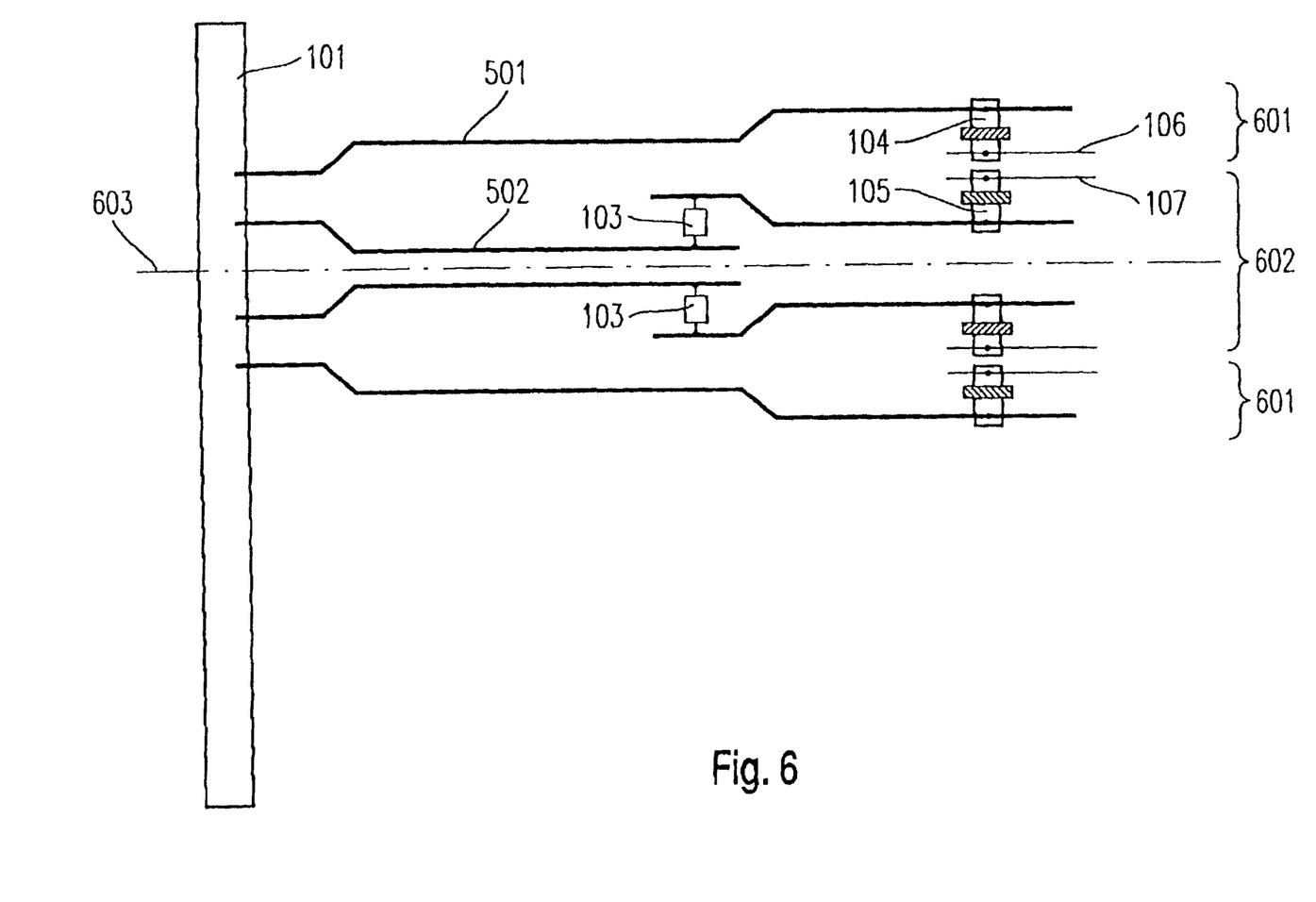
FIG. 6 shows a circuit arrangement for scalable output drivers according to the present invention, the illustration showing a first driver transistor group and a second driver transistor group, which is mirrored with respect to the first driver transistor group.

FIG. 6 shows a circuit arrangement for scalable output drivers according to the present invention, the illustration showing a first driver transistor group and a second driver transistor group, which is mirrored with respect to the first driver transistor group.

The circuit arrangement shown in FIG. 6 shows two driver transistor groups which are arranged symmetrically with regard to a line 603 of symmetry perpendicular to the output terminal unit 101. Respective p-channel units and n-channel units are formed in this way. A single p-channel unit 601 is in each case formed at the edge of the circuit arrangement comprising two driver transistor groups which is shown in FIG. 6, while a double n-channel unit 602 is formed in the center. Advantages in the design of the circuit result from this symmetrical circuit arrangement, and also because the same electrical properties are provided toward the terminal unit 101.

Figure 7:
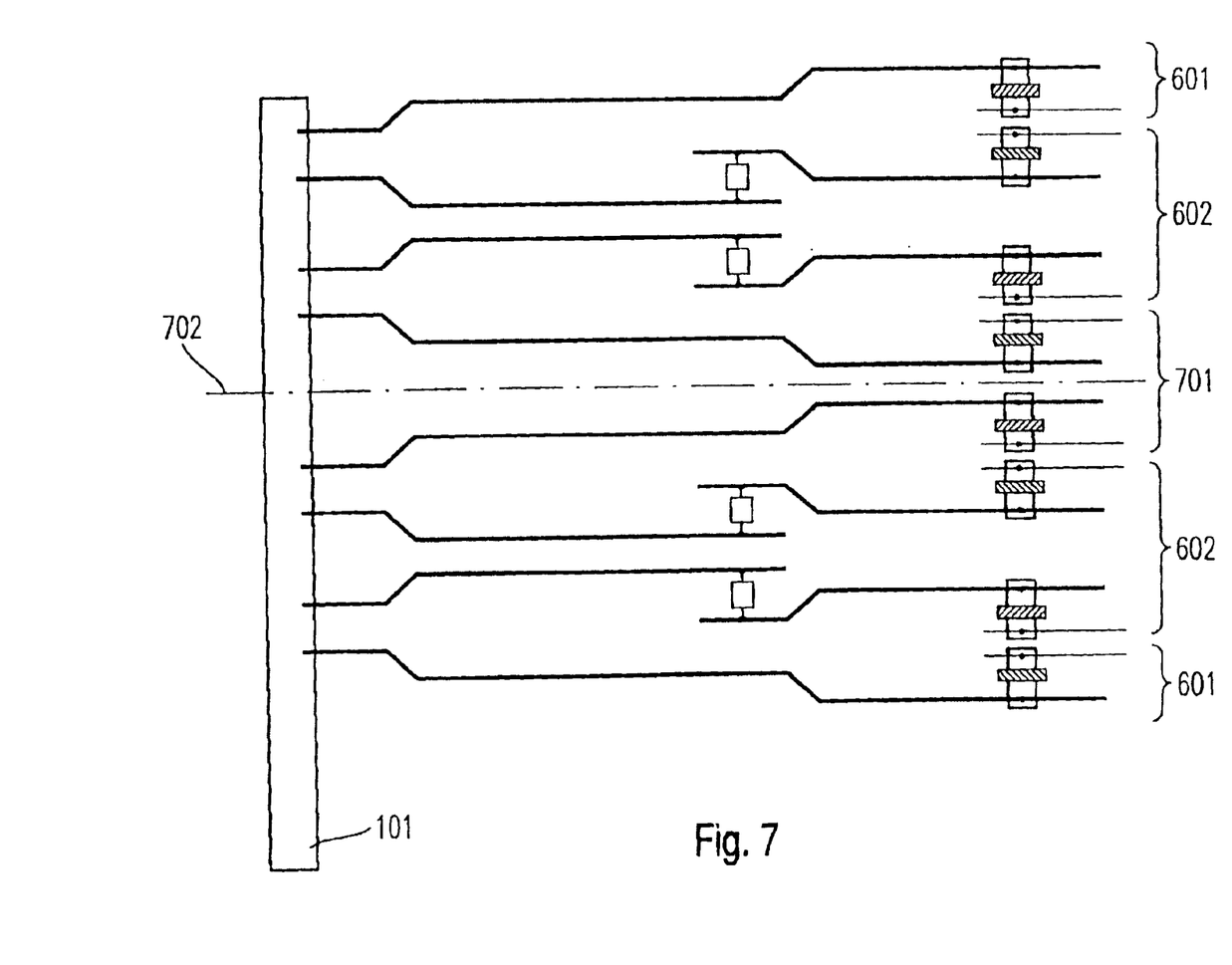
FIG. 7 shows a circuit arrangement for scalable output drivers according to the present invention which comprises a total of four driver transistor groups.

FIG. 7 shows a circuit arrangement for scalable output drivers according to the present invention which comprises a total of four driver transistor groups.

In the circuit arrangement shown in FIG. 7, four driver transistor groups 504 are provided, the circuit arrangement shown in FIG. 6 being mirrored at a line 702 of symmetry. In the exemplary embodiment shown, it is possible to realize four driver transistor groups with transistor pairs having a different transistor line or width 201, thereby achieving a scalability of $2^3$. Generally, if m is the number of driver transistor groups 504 which are arranged symmetrically with respect to one another, it holds true that it is possible to achieve $2^{(n-1)}$ different gradations with regard to scalability.

The circuit arrangements illustrated using exemplary embodiments described above thus allow the design of scalable output drivers which have great variability.

In addition to simple scalability through a transistor line width that is simple to design, the present invention makes it possible to provide identical electrical properties toward the output terminal unit for all transistors of all driver transistor groups. In addition to a reduction of costs through a simpler construction, this furthermore facilitates a construction of fast output drivers.

Although the present invention has been described above using preferred exemplary embodiments, it is not restricted thereto, but rather can be modified in diverse ways.

List of reference symbols
In the FIGURES, identical reference symbols designate identical or functionally identical components.

| | |
|---|---|
| 101 | Output terminal unit |
| 102 | Input terminal unit |
| 103 | Resistance element |
| 104 | p-channel transistor |
| 105 | n-channel transistor |
| 106 | Voltage supply line |
| 107 | Ground line |
| 108 | Control line |
| 201, B | Transistor line width |
| 501 | First output interconnect |
| 502 | Second output interconnect |
| 503 | Drain resistance interconnect |
| 504 | Driver transistor group |
| 601 | Single p-channel unit |
| 602 | Double n-channel unit |
| 603 | Line of symmetry |
| 701 | Double p-channel unit |
| 702 | Line of symmetry |
| B | Transistor line width |
| D | Drain terminal |
| ESD | Electrostatic discharge |
| FET | Field-effect transistor |
| G | Gate terminal |
| S | Source terminal |

What is claimed is:

1. A circuit for scalable output drivers, the circuit comprising:
   a first pair of driver transistors forming a driver transistor group;
   an interconnect arranged with respect to an output terminal unit and an input terminal unit, the interconnect connecting the driver transistor group to the output terminal unit;
   a first resistance element arranged on the same side of the output terminal unit as the driver transistor group; and
   a second pair of driver transistors and a second resistance element, which are arranged symmetrically with respect to the first pair of driver transistors and with respect to the first resistance element with regard to a line of symmetry.

2. The circuit of claim 1 wherein the driver transistor group is formed from an n-channel transistor and a p-channel transistor, the first resistance element being inserted between the drain terminal of the n-channel transistor and the output terminal unit to provide protection against an electrostatic discharge.

3. The circuit of claim 1 wherein the interconnect of the driver transistor group includes identical geometrical dimensions toward the output terminal unit.

4. The circuit of claim 1 wherein the second pair of the driver transistor of a driver transistor group are connected to the output terminal unit via first and second output interconnects, the second pair of driver transistors further comprising an identical transistor line width.

5. The circuit of claim 1 wherein the second resistance element is connected between a drain resistance interconnect and a second output interconnect.

6. The circuit of claim 1 wherein the driver transistor group is arranged symmetrically with regard to the line of symmetry running parallel to the second output interconnect and wherein two driver transistor groups drive the output terminal unit.

7. The circuit of claim 1 wherein a number m of driver transistor groups are arranged symmetrically and two n-channel units and two p-channel units are located adjacent to one another.

8. The circuit of claim 1 wherein the resistance element protects against electrostatic discharges and is connected between the drain terminal of an n-channel transistor and the output terminal unit.

9. The circuit of claim 2 wherein the source-drain path of the p-channel transistors is oriented parallel to the output terminal unit.

10. The circuit of claim 2 wherein the source-drain path of the n-channel transistors is oriented parallel to the output terminal unit.

11. The circuit of claim 2 wherein the source-drain path of the p-channel transistors is oriented parallel to the interconnect.

12. The circuit of claim 2 wherein the source-drain path of the n-channel transistors is oriented parallel to the interconnect.

13. The circuit of claim 2 wherein the resistance element is oriented parallel to the output terminal unit.

14. The circuit of claim 2 wherein the n-channel transistors and the p-channel transistors are designed as field effect transistors (FET).

15. The circuit of claim 4 wherein the first and second output interconnects and a drain resistance interconnect include a 45-degree angle change in direction.

16. The circuit of claim 2 wherein the driver transistor group is freely scalable by a free scalability of the transistor line width of the p-channel and the n-channel transistor.

17. The circuit of claim 1 wherein the first resistance element arranged parallel to the output terminal unit is freely scalable.

18. The circuit of claim 4 wherein the transistor line width for a pair of transistors forming a driver transistor group is freely adjustable.

19. The circuit of claim 2 wherein gate terminals of the n- and p-channel transistors are located asymmetrically with respect to the source-drain path of the transistors and the distance between the gate terminals and the interconnect is greater than the distance between the gate terminals and a source terminal.

20. A method for scaling output drivers, the method comprising:
   arranging at least one first pair of driver transistors forming a driver transistor group;
   arranging interconnects for connecting the driver transistor group to the output terminal unit;
   arranging a resistance element on the same side of the output terminal unit as the driver transistor group; and
   arranging a second pair of driver transistors and a second resistance element symmetrically with respect to the first pair of driver transistors and with respect to the first resistance element with regard to a line of symmetry.

21. The method of claim 20 wherein an output voltage in the output terminal unit is set between 0 volts of a ground line and $V_{CC}$ of a voltage supply line.

22. The method of claim 20 wherein a transistor line width of the transistors can be set in powers of two.

* * * * *